ent Number: 4,827,607
Date of Patent: May 9, 1989

United States Patent [19]
Korsunsky et al.

[54] INSERTION TOOL

[75] Inventors: Iosif Korsunsky, Harrisburg; Gerald L. Foreman, Hummesltown, both of Pa.

[73] Assignee: AMP Incorporated, Harrisburg, Pa.

[21] Appl. No.: 216,935

[22] Filed: Jul. 8, 1988

[51] Int. Cl.⁴ ............................................. H05K 3/30
[52] U.S. Cl. ........................................ 29/741; 29/740; 29/747
[58] Field of Search ................. 29/740, 741, 739, 758, 29/747, 764

[56] References Cited

U.S. PATENT DOCUMENTS

| | | | |
|---|---|---|---|
| 3,538,580 | 11/1970 | Bruner | 29/741 |
| 3,896,533 | 7/1975 | Ullman | 29/741 |
| 4,660,281 | 4/1987 | Omand | 29/764 |
| 4,679,319 | 7/1987 | Grabbe | 29/843 |

OTHER PUBLICATIONS

AMP Instruction Sheet IS-7510, released 04-27-71.

*Primary Examiner*—Carl E. Hall
*Attorney, Agent, or Firm*—Bruce J. Wolstoncroft

[57] ABSTRACT

A tool (50) for inserting a chip carrier (2) into the recess of a chip carrier socket (10). In operation, the tool (50) is positioned in alignment with socket (10), chip carrier (2), and cover (32). The tool is actuated causing the engagement means (56, 58) to pivot about pins (102). This pivoting action causes shoulders (94) to engage a lower surface of the socket (10), thereby retaining the tool (50) in position as second major surface (62) of support block (54) inserts chip carrier (2) and cover (32) into socket (10). The retention feature of the shoulders (94) is insured due to the bowing action of spring member (96), which causes the shoulders to be tightly maintained in cooperation with the lower surface of the socket (10).

15 Claims, 5 Drawing Sheets

INSERTION TOOL

FIELD OF THE INVENTION

This invention relates to an insertion tool for inserting a chip carrier into a chip carrier socket. In particular the invention is directed to a tool which insures that the insertion forces will be distributed evenly over the surface of the chip carrier.

BACKGROUND OF THE INVENTION

Integrated circuits are commonly mounted in chip carriers which are bodies of insulating material having side surfaces to which conductors from the integrated circuit extend. Traditionally, terminal pads are provided on the side surfaces of the chip carrier body and contact is made with these pads to connect the integrated circuit to conductors on a substrate, such as a ceramic substrate or a circuit board. Electrical connection is usually established with the terminal pads on the chip carrier by means of a chip carrier socket which comprises a socket body having a recess which receives the chip carrier and contact terminals in surrounding relationship to the recess so that when the chip carrier is placed in the recess, the contact terminals electrically engage the terminal pads of the chip carrier.

Notwithstanding the relatively small size of the chip carrier socket and the contact terminals in the socket, it is necessary that each terminal be capable of exerting contact force on a terminal pad in a chip carrier in order to establish good electrical connection between the contact terminal and the terminal pad on the chip carrier, particularly if the terminal pad is tin plated rather than gold plated. It should also be noted that chip carriers and chip carrier sockets are subject to the dimensional variations which all mass produced parts are subjected to. These dimensional variations result from manufacturing tolerances. However, even with dimensional variation, the design and performance requirements discussed briefly above must be satisfied even in "worst case" conditions. For example, the minimum 200 gram contact force required for each contact must be met even if the particular terminal pad that a contact terminal engages is at the lower end of the tolerance range and the contact terminal similarly is at the lower end of the tolerance range of the parts.

It is therefore essential that a chip carrier socket be provided with the capability to insure that the appropriate force be exerted on the contact terminals. It would also be helpful to have a tool which is configured to allow for the easy and reliable insertion of the chip carrier into the chip carrier socket. An insertion tool which is configured to distribute the insertion force evenly over the surface of the chip carrier would insure that each terminal pad of the chip carrier would be placed in reliable electrical connection with each terminal of the socket. Therefore, the use of an appropriate insertion tool is beneficial to the reliability of the electrical connection between the chip carrier and the socket.

SUMMARY OF THE INVENTION

The invention is directed to an insertion tool which is easy to use and provides for proper seating of a chip carrier in a chip carrier socket. In order to insure that a reliable interconnection is effected it is important to provide a tool which distibutes the insertion force evenly over all of the leads of the chip carrier. It is also important that the tool provides the insertion force required to effect the electrical connection, without damaging the chip carrier or the chip carrier socket.

According to the invention, an insertion tool comprises handle means which are provided so that the operator can activate the tool. The handle means have inner ends and outer ends. A support block is positioned in cooperation with the inner ends of the handle means. The support block has camming means provided on surfaces thereof. Insertion means are provided adjacent the support block, the insertion means cooperates with the chip carrier to insert the chip carrier into the chip carrier socket.

Engagements means are provided proximate the surfaces of the support block which have the camming means provided thereon. The engagement means are attached to the outer ends of the handle means. Resilient spring means extend proximate the support block, ends of the resilient spring means are attached to the engagement means and the outer ends of the handle means.

Whereby when the tool is in use, portions of the engagement means are forced to move toward each other. This allows the portions of the engagement means to cooperate with a lower surface of the chip carrier socket, thereby holding the insertion tool in position as the insertion means cooperates with the chip carrier to insert the chip carrier into the recess of the chip carrier socket.

DETAILED DESCRIPTION OF THE INVENTION

Figure 5:
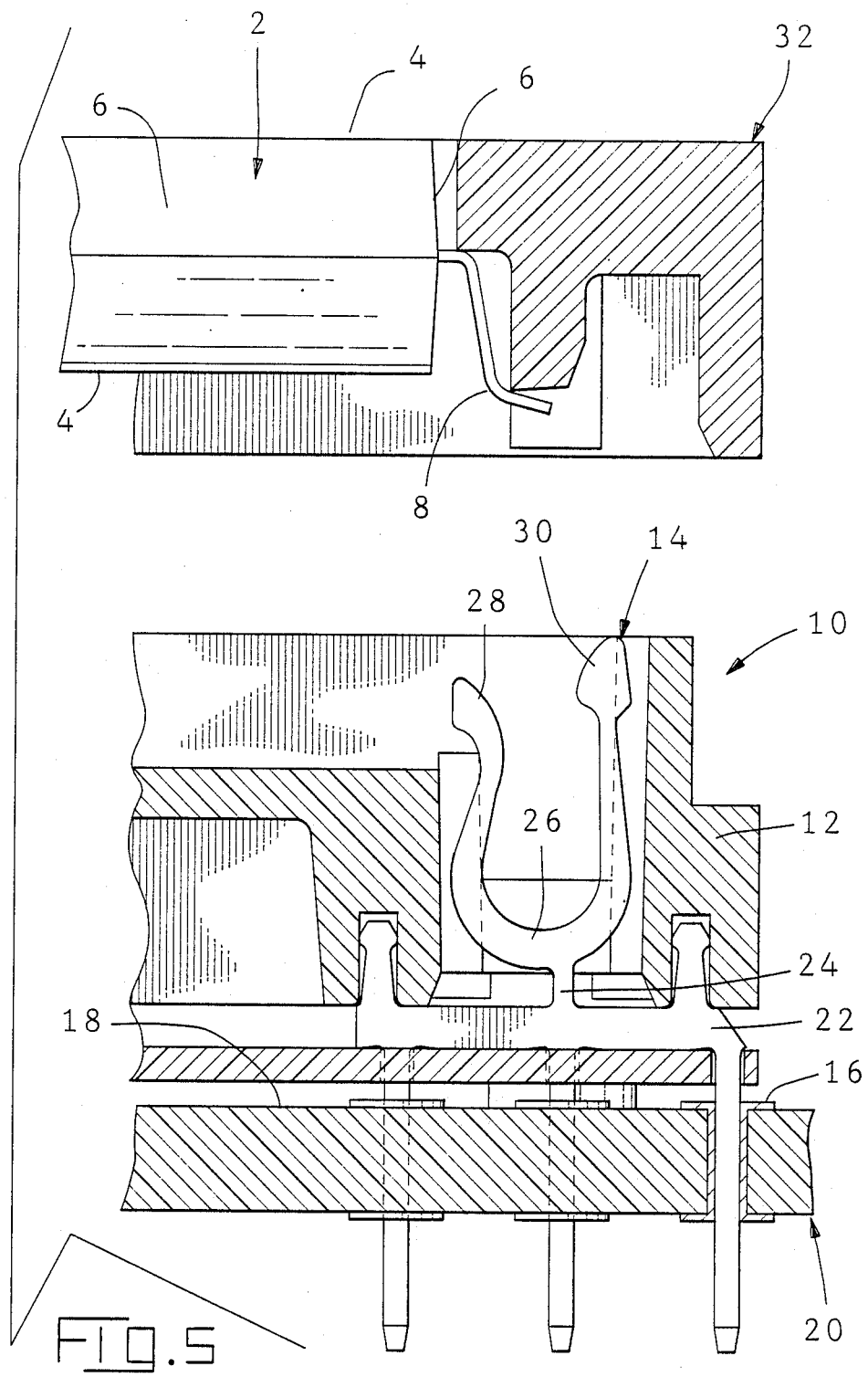
FIG. 5 is a fragmentary view showing the chip carrier and cover prior to insertion into the chip carrier socket.
Figure 6:
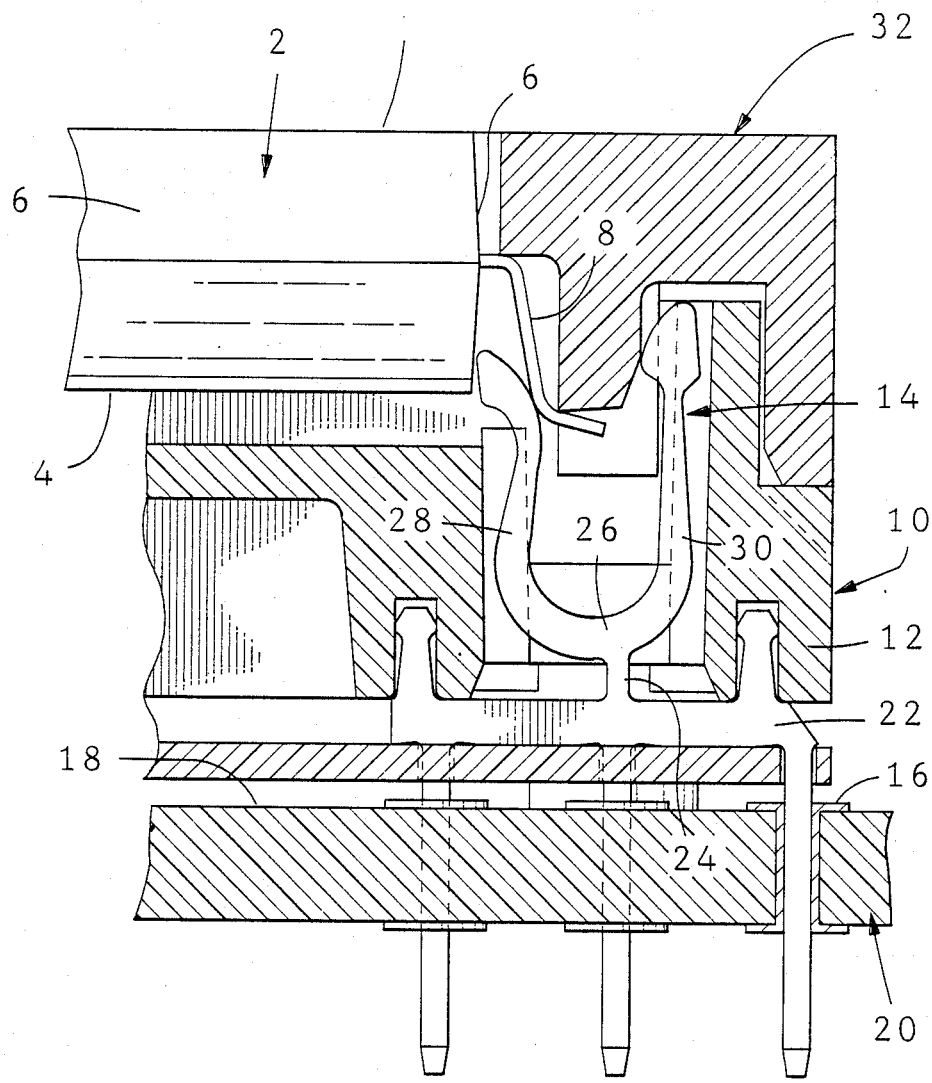
FIG. 6 is a fragmentary view, similar to that of FIG. 5, showing the chip carrier and the cover completely inserted and secured in the chip carrier socket.

Referring to FIGS. 5 and 6, a typical integrated circuit chip carrier 2 comprises a flat square body of insulating material having oppositely-facing major surfaces 4 and outwardly directed side surfaces 6 on which there are provided spaced-apart contact zones or leads 8. These contact zones are connected by conductors embedded in the insulating body to an integrated circuit chip which is also embedded in the insulating body.

In order to connect the contact zones 8 on the IC chip carrier to conductors on a substrate such as a circuit board, a chip carrier socket assembly 10 is provided as shown in FIGS. 5 and 6. The socket assembly 10 comprises a socket housing 12 containing terminals 14 which are electrically connected to terminal pads 16 on an upper surface 18 of the substrate 20. Each terminal 14 is a flat stamped member having a base 22, a neck 24, a terminal yoke 26 and arms 28, 30 extending from the yoke.

A chip carrier cover 32 is provided to cooperate with chip carrier 2, to insure that chip carrier 2 will be undamaged during the transportation thereof. The cover also cooperates with the contact zones 8 of the chip carrier and with the arms 28, 30 of the terminals 14 to provide the electrical stability required for operation.

The housing, terminals, and cover are more fully described in U.S. application Ser. No. 116,770 filed Nov. 3, 1987 which is hereby incorporated by reference in its entirety.

Referring now to FIGS. 1 through 4, a tool 50 in accordance with the invention is configured to be used with chip carrier socket assembly 10 or the like. The tool 50 is used for the insertion of the chip carrier 2 and cover 32 into the socket assembly 10, thereby placing the leads 8 of the chip carrier 2 in electrical engagement with the terminals 14 of the socket assembly 10.

Figure 2:
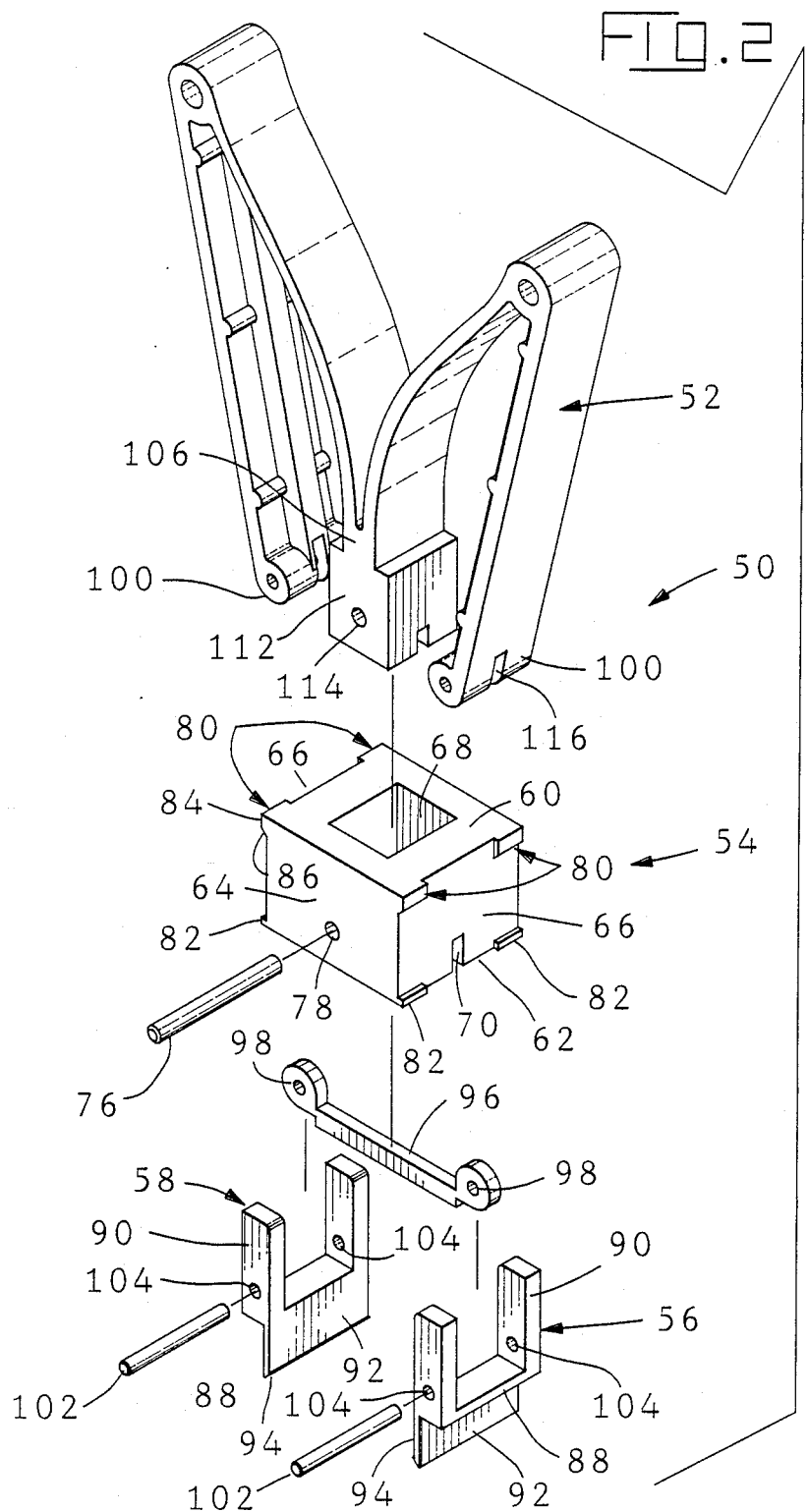
FIG. 2 is an exploded perspective view of the hand tool, showing the various components of the hand tool.

Tool 50 comprises a handle means 52, a support block 54, and engagement means 56, 58. As is best shown in FIG. 2, support block 54 has a first major surface 60, a second major surface 62, opposed side surfaces 64, and opposed end surfaces 66. Support block 54 is made of a plastic material, or any other material which has the strength characteristics required.

An opening 68 is provided in the first major surface 60 of support block 54. The opening extends from first major surface 60 in a direction toward second major surface 62. The opening 68 is provided to cooperate with a portion of the handle 52, as will be discussed. A slot or recess 70 is provided in the second major surface 62 of block 54, the recess 70 extends from the second major surface 62 toward the first major surface 60. The depth of the recess 70 is greater proximate end surfaces 66. This is due to the fact that a projection 72 extends into the center of recess 70 from an upper wall 74 thereof. Projection 72 extends toward second major surface 62.

A securing rod 76 is provided in support block 54. Rod 76 extends between side surfaces 64 through openings 78 provided in the side surfaces. As can be seen in FIG. 2, securing rod 76 extends through opening 68.

Provided on side surfaces 64 are camming means 80 and projections 82. Projections 82 are provided on side surfaces 64 proximate second major surface 62. In the embodiment shown in FIG. 2, two projections 82 are provided on each side surface 64. However, other configurations of projections are possible.

Figure 3:
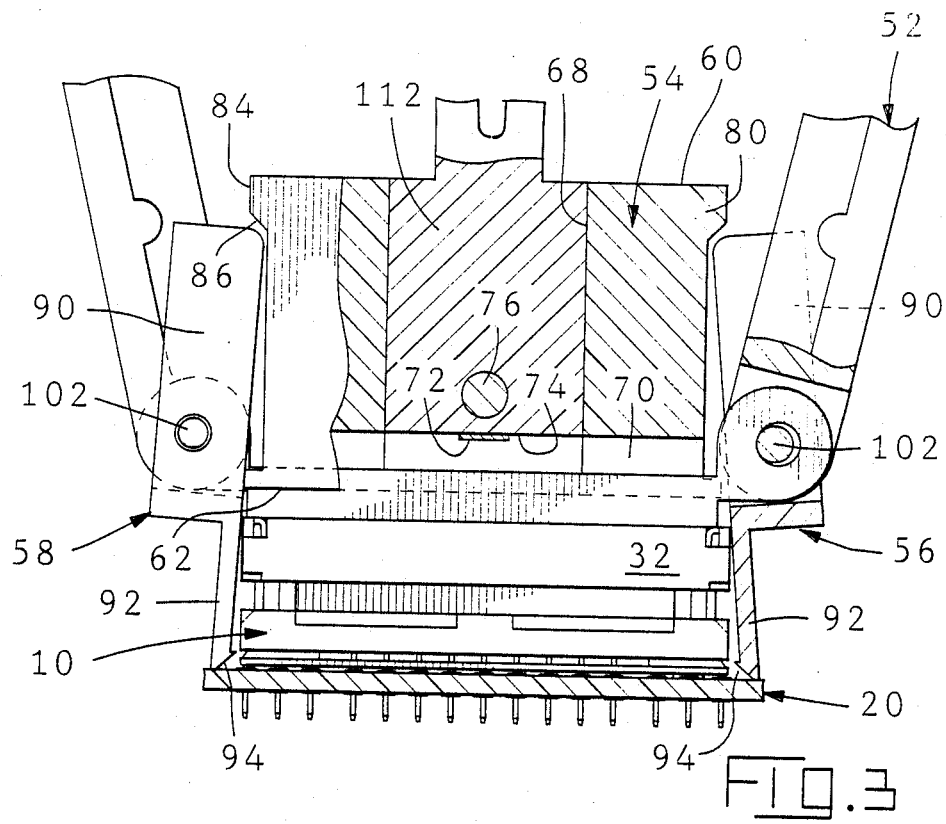
FIG. 3 is a partial view of the hand tool positioned in alignment with the chip carrier and the chip carrier socket, the hand tool is shown in the open position.
Figure 4:
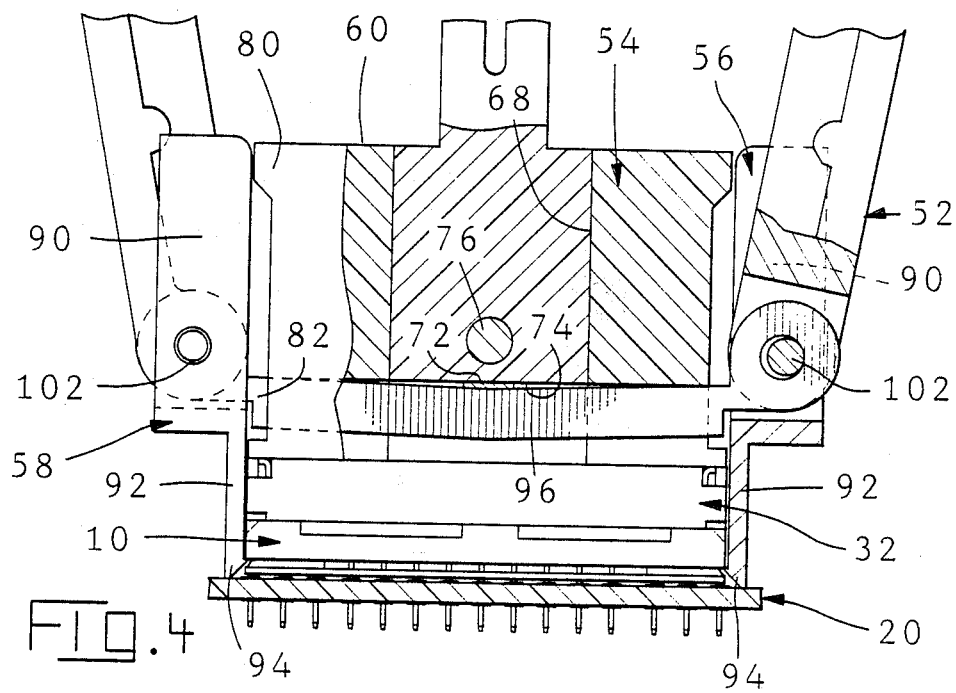
FIG. 4 is a partial view similar to that shown in FIG. 3, the hand tool is shown in the closed position, with the chip carrier inserted into the chip carrier socket.

Camming means 80 are provided proximate first major surface 60. As shown in FIGS. 3 and 4, each camming means 80 has a flat surface 84 which is essentially parallel to the respective side surface 64. Extending from each flat surface 84 in a direction toward the respective side surface 64 and toward the second major surface 62 is a sloping surface 86. The angle of the sloping surface can vary according to the characteristics required.

Positioned proximate side surfaces 64 of support block are engagement means 56, 58. Engagement means 56, 58 are comprised of base portions 88 and arm portions 90. As is shown in FIG. 2, arm portions 90 are positioned at either end of base portions 88, and extend in a direction which is essentially perpendicular to the base portions. As will be more fully discussed below, arm portions 90 cooperate with camming means 80 and base portions 88 cooperate with projections 82.

Plates 92 extend from base portions 88 in a plane which is essentially parallel to the plane of arm portions 90. However, plates 92 extend from base portions 88 in the opposite direction as arm portions 90. Provided at the free ends of plates 92 are engagement shoulders 94, the shoulders are provided to engage the chip carrier socket assembly, as will be discussed.

A resilient spring member 96 is provided which cooperates with engagement means 56, 58 and support block 54. The spring member 96 is positioned in recess 70 of support block 54. Member 96 has openings 98 provided proximate the ends thereof. Spring member 96 cooperates with engagement means 56, 58 to insure that the engagement means will be maintained in a position which is proximate end surfaces 66 of support block 54.

Figure 1:
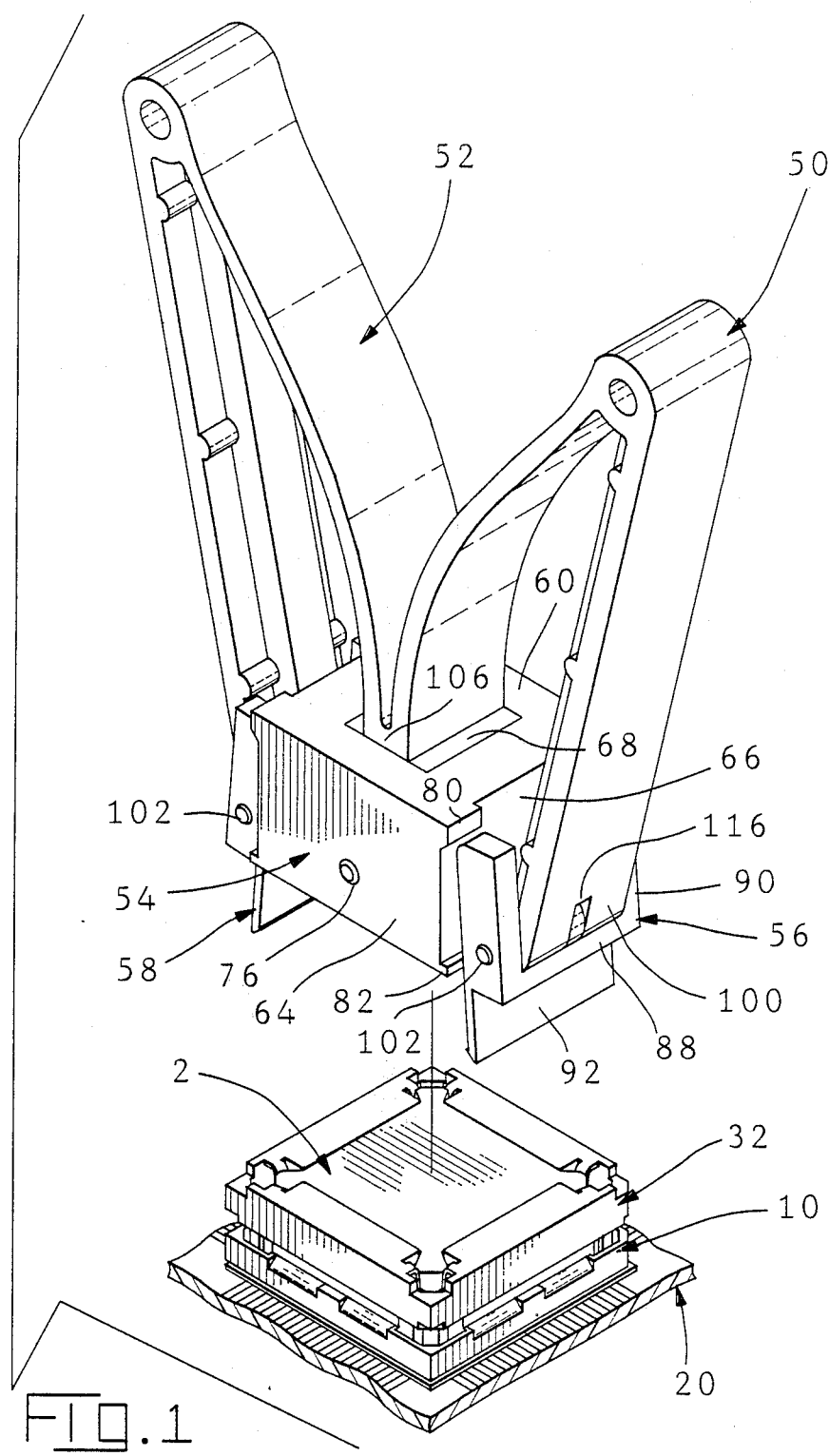
FIG. 1 is a perspective view of a hand tool according to the invention prior to being inserted over a chip carrier and chip carrier socket.

Handle 52 is manufactured from plastic or any other material having the characteristics desired for operation. Handles 52 have ends 100 which are attached to pins 102. Pins 102 extend through openings 104 of arm portions 90. The cooperation of ends 100 with pins 102 allows for ends 100 to be pivoted about pins 102. As is best shown in FIG. 1, pins 102 secure respective engagement means 56, 58 with spring member 96 and handle 52. As is shown in FIGS. 3 and 4, openings 98 of spring member 96 are dimensioned slightly larger than the diameter of pins 102. The use of pins 102 allows all of the various components connected thereto to pivot with respect to each other when tool 50 is in operation.

At inner ends 106 of handles 52, an adapter block 112 is provided. Adapter block 112 is secured in opening 68 by the positioning of rod 76 in openings 114 of block 112.

As can be seen in FIGS. 1 and 2, ends 100 have slots 116 provided proximate the center thereof. Slots 116 cooperate with spring member 96 to insure that spring member 96 is maintained in recess 70 of support block 54.

In use, when chip carrier 2 is to be inserted into chip carrier socket assembly 10, chip carrier 2 and cover 32 are positioned over chip carrier socket assembly 10, such that leads 8 of chip carrier 2 are provided in alignment with terminals 14 of socket assembly 10. With the chip carrier and the cover provided in position, tool 50 is aligned with socket assembly 10. The proper alignment of tool 50 has engagement means 56, 58 provided proximate respective side surfaces of socket assembly 10. It should be noted that, when tool 50 is in an unstressed or open position, the spacing between plates 92 is greater than the width of socket assembly 10, thereby facilitating the placement of tool 50 over socket assembly 10. In this open position shoulders 94 of plates 92 are provided proximate substrate 20, and second major surface 62 of support block 54 is provided proximate upper major surface of chip carrier 2.

With the various components 2, 10, 32 and tool 50 provided in alignment, the handles 52 of tool 50 are forced toward each other. This causes pins 102 to be moved away from second major surface 62 of support block 54 (as is shown in FIGS. 5 and 6), in a direction which is essentially parallel to side surfaces 64. This movement of pins 102 forces the free ends of arm portions 90 to move in a similar manner which result in arm portions 90 to slidingly engage sloping surfaces 86 of block 54.

The sliding motion of the free ends of arm portions 90 along sloping surfaces 86 causes the free ends to rotate about pins 102, such that as the free ends of arm portions 90 are rotated away from respective side surfaces 64 of support block 54, the free ends of plates 92 are rotated toward the side surfaces of socket assembly 10. This rotation of plates 92 insures that shoulders 94 will be cammed into engagement with the lower surface of socket assembly 10, as shown in FIG. 6. With shoulders 94 positioned in engagement with the lower surface, handles 52 are continued to be forced together, causing the continued upward motion of pins 102 in a plane which is parallel to side surfaces 64. As the free ends of arm portions 90 move in a similar manner, the free ends move past sloping surfaces 86 and into engagement with flat surfaces 84. The cooperation of flat surfaces 84 and the free ends maintains the free ends in the rotated position as described. Consequently, shoulders 94 of plates 92 are maintained in engagement with the lower surface of assembly 10.

As handles 52 are forced together, support block 54 is moved downward, toward circuit board 20. This downward movement causes second major surface 62 of support block 54 to engage the upper surfaces of cover 32 and chip carrier 2, thereby forcing the combination downward into engagement with assembly 10. This downward motion of block 54 is continued until leads 8 of chip carrier 2 are secured in electrical engagement with terminals 14 of assembly 10.

It should be noted that the force needed to insert leads 8 and cover 32 in terminals 14 is greatest just prior to when the leads and cover are secured in the terminals. This is due to the resilient nature of the terminals 14. It is therefore essential that shoulders 94 be maintained in engagement with the lower surface of assembly 10 when the peak forces are obtained. In order to insure that the cooperation between shoulders 94 and the lower surface of assembly 10 will not fail, spring member 96 supplies an increased force which draws plates 92 and shoulders 94 toward each other at the time when the peak force must be overcome.

This increased force is provided by the cooperation of projection 72 with spring member 96. As pins 102 are forced upward, spring member 96, which is attached to pins 102, is forced further into recess 70. As this occurs a center portion of spring member 96 engages projection 72. Consequently, the continued upward motion of spring member 96 into recess 70 causes spring member 96 to bow or bend about projection 72. This bowing action results in the ends of spring member 96 being forced inward toward end surfaces 66 of support block 54. As engagement means 56, 58 are attached to the ends of members 96, the inward motion of members 96 forces plates 92 and shoulders 94 inward, toward the side surfaces of assembly 10. This movement insures that shoulders 94 will not disengage from the lower surface of assembly 10, no matter the force involved.

The cooperation of spring member 96 and projection 72 also acts as a stop member. In other words, second major surface 62 of support block 54 can only be moved toward the chip carrier socket a fixed distance, before spring member 96 engages projection 72 to limit any further downward motion. This insures that the insertion force extered by the tool onto the chip carrier will not be large enough to cause the failure of the chip carrier and the chip carrier socket.

It is also important to note, that the operation of tool 50 insures that the insertion forces will be distributed evenly over the surface of cover 32 and chip carrier 2. This even distribution of forces is due to the uniform movement of second major surface 62 of support block 54 with respect to assembly 10. The even distribution of insertion force results in a positive electrical connection being effected between each lead and each respective terminal, particularly when the leads and the terminals are closely spaced. 9n

What is claimed is:

1. An insertion tool for inserting a chip carrier into a recess of a chip carrier socket, the insertion tool comprising:
   handle means having inner ends and outer ends;
   a support block having camming means provided on surfaces thereof, the support block being positioned in cooperation with the inner ends of the handle means and a chip carrier engaging surface;
   engagement means provided proximate the surfaces of the support block which have the camming means provided thereon, the engagement means being attached to the outer ends of the handle means;
   resilient spring means extending proximate the support block, ends of the resilient spring means being attached to the engagement means and the outer ends of the handle means;
   whereby when the tool is in use, portions of the engagement means are forced to move toward each other, such that the portions of the engagement means cooperate with a lower surface of the chip carrier socket, thereby holding the insertion tool in position as the chip carrier engaging surface engages the chip carrier to insert the chip carrier into the recess of the chip carrier socket.

2. An insertion tool as recited in claim 1 wherein the support block has a first major surface, a second major surface, oppositely facing side surface, and oppositely facing end surfaces.

3. An insertion tool as recited in claim 2 wherein an opening is provided in the first major surface which extends in a direction toward the second major surface, the inner ends of the handle are positioned in the opening and secured therein.

4. An insertion tool as recited in claim 2 wherein the insertion means of the tool is the second major surface of the support block.

5. An insertion tool as recited in claim 2 wherein the camming means are provided on the opposed end surfaces of the support block, the camming means project outward from the end surfaces, away from the support block.

6. An insertion tool as recited in claim 5 wherein the camming means have a flat surface and a sloping surface, the flat surface being positioned in a plane which is essentially parallel to the plane of a respective end surface, the sloping surface extending from the flat surface in a direction which is toward the respective end surface and toward the second major surface of the support block.

7. An insertion tool as recited in claim 6 wherein the camming means are provided proximate the first major surface of the support block.

8. An insertion tool as recited in claim 7 wherein engagement projections extend from the end surfaces of the support block in a direction which is esentially perpendicular to the plane of the end surfaces, the engagement projections are positioned proximate the second major surface of the support block.

9. An insertion tool as recited in claim 1 wherein the engagement means are provided on opposed sides of the support block, such that the spacing between free ends of the engagement means is greater than the width of the chip carrier socket.

10. An insertion tool as recited in claim 9 wherein each of the engagement means has a base portion, arm portions which extend from the base portion, and a plate which extends from the base portion in the opposed direction as the arm portions, the arm portions cooperate with the camming means of the support block.

11. An insertion tool as recited in claim 10 wherein the plates of the engagement means have shoulders provided at free ends thereof, such that as the arm portions cooperate with the camming means, the shoulders are forced to cooperate with a major surface of the chip carrier socket, to maintain the tool in cooperation with the chip carrier socket as the insertion means cooperates with the chip carrier.

12. An insertion tool as recited in claim 11 wherein the engagement means are connected to the outer portions of the handle by pins, such that as the handles are moved, the engagement means are forced to cooperate with the camming means, the pins allowing the engagement means to pivot as the camming means is engaged.

13. An insertion tool as recited in claim 2 wherein a channel is provided in the second major surface of the support block, the channel extending toward the first major surface.

14. An insertion tool as recited in claim 13 wherein a projection is provided proximate the center of the channel, the projection extending from an upper surface of the channel toward the second major surface, such that as the spring means is moved from the second major surface toward the first major surface, a center portion of the spring means will engage the projection, causing the spring means to bend about the projection, thereby causing end portions of the spring means to move toward the end surfaces of the support block.

15. An insertion tool as recited in claim 14 wherein the ends of the spring means are pivotally attached to the engagement means, such that as the spring means is bent around the projection, the movement of the ends will cause the engagement means to be moved closer to the end surfaces of the support block, thereby insuring that the engagement means will be maintained in engagement with the chip carrier socket as the chip carrier is inserted into the recess of the chip carrier socket.

* * * * *